(12) United States Patent
Fenouillet-Beranger et al.

(10) Patent No.: US 9,029,955 B2
(45) Date of Patent: May 12, 2015

(54) INTEGRATED CIRCUIT ON SOI COMPRISING A BIPOLAR TRANSISTOR WITH ISOLATING TRENCHES OF DISTINCT DEPTHS

(71) Applicants: Commissariat à l'énergie atomique et aux énergies alternatives, Paris (FR); STMicroelectronics SA, Montrouge (FR)

(72) Inventors: Claire Fenouillet-Beranger, Grenoble (FR); Pascal Fonteneau, Theys (FR)

(73) Assignees: Commissariat á l'énergie atomique et aux énergies alternatives, Paris (FR); STMicroelectronics SA, Mountrouge (FR)

( * ) Notice: Subject to any disclaimer, the term of this patent is extended or adjusted under 35 U.S.C. 154(b) by 0 days.

(21) Appl. No.: 13/933,396

(22) Filed: Jul. 2, 2013

(65) Prior Publication Data

US 2014/0017871 A1 Jan. 16, 2014

(30) Foreign Application Priority Data

Jul. 13, 2012 (FR) ..................................... 12 56806

(51) Int. Cl.
*H01L 29/66* (2006.01)
*H01L 27/02* (2006.01)
(Continued)

(52) U.S. Cl.
CPC ...... *H01L 29/66234* (2013.01); *H01L 27/0259* (2013.01); *H01L 27/0296* (2013.01);
(Continued)

(58) Field of Classification Search
CPC ............ H01L 27/0259; H01L 27/0296; H01L 27/0688; H01L 27/1207; H01L 29/66234; H01L 29/78606; H01L 29/0649; H01L 29/66272; H01L 29/732
USPC ......... 257/197, 370, 517, 557, 558, 378, 565, 257/587, 593, E21.371, E21.696, E29.187; 438/204, 202, 207, 234, 318
See application file for complete search history.

(56) References Cited

U.S. PATENT DOCUMENTS

| | | | |
|---|---|---|---|
| 4,669,177 A | * | 6/1987 | D'Arrigo et al. ............. 438/204 |
| 5,484,738 A | * | 1/1996 | Chu et al. ..................... 438/152 |

(Continued)

OTHER PUBLICATIONS

Dattu R. Joshi, "Engineering Physics", Tata McGraw Hill, New Delhi, 2010, p. 7.2, ISBN-13: 978-0-07-070477-0.*

(Continued)

*Primary Examiner* — Marvin Payen
*Assistant Examiner* — Victor Barzykin
(74) *Attorney, Agent, or Firm* — Occhiuti & Rohlicek LLP

(57) ABSTRACT

An integrated circuit includes a semiconductor substrate, a silicon layer, a buried isolating layer arranged between the substrate and the layer, a bipolar transistor comprising a collector and emitter having a first doping, and a base and a base contact having a second doping, the base forming a junction with the collector and emitter, the collector, emitter, base contact, and the base being coplanar, a well having the second doping and plumb with the collector, emitter, base contact and base, the well separating the collector, emitter and base contact from the substrate, having the second doping and extending between the base contact and base, a isolating trench plumb with the base and extending beyond the layer but without reaching a bottom of the emitter and collector, and another isolating trench arranged between the base contact, collector, and emitter, the trench extending beyond the buried layer into the well.

11 Claims, 2 Drawing Sheets

(51) Int. Cl.
 *H01L 27/06* (2006.01)
 *H01L 29/786* (2006.01)
 *H01L 27/12* (2006.01)
 *H01L 29/732* (2006.01)
 *H01L 29/06* (2006.01)

(52) U.S. Cl.
 CPC ...... *H01L27/0688* (2013.01); *H01L 29/78606* (2013.01); *H01L 27/1207* (2013.01); *H01L 29/66272* (2013.01); *H01L 29/732* (2013.01); *H01L 29/0649* (2013.01)

(56) References Cited

U.S. PATENT DOCUMENTS

| | | | | |
|---|---|---|---|---|
| 5,521,399 | A * | 5/1996 | Chu et al. | 257/36 |
| RE35,442 | E * | 2/1997 | Contiero et al. | 257/370 |
| 5,789,790 | A * | 8/1998 | Morishita et al. | 257/378 |
| 5,923,067 | A | 7/1999 | Voldman | |
| 5,998,854 | A * | 12/1999 | Morishita et al. | 257/565 |
| 6,071,763 | A | 6/2000 | Lee | |
| 6,229,179 | B1 * | 5/2001 | Song et al. | 257/350 |
| 6,365,447 | B1 * | 4/2002 | Hebert et al. | 438/203 |
| 6,476,450 | B2 * | 11/2002 | Kondo et al. | 257/370 |
| 6,555,874 | B1 * | 4/2003 | Hsu et al. | 257/347 |
| 6,563,193 | B1 * | 5/2003 | Kawaguchi et al. | 257/575 |
| 6,569,730 | B2 * | 5/2003 | Tsai et al. | 438/234 |
| 6,815,800 | B2 * | 11/2004 | Mallikarjunaswamy | 257/565 |
| 6,815,822 | B2 * | 11/2004 | Kondo et al. | 257/758 |
| 6,936,910 | B2 * | 8/2005 | Ellis-Monaghan et al. | 257/552 |
| 7,145,206 | B2 * | 12/2006 | Mallikarjunaswamy | 257/370 |
| 8,115,280 | B2 * | 2/2012 | Chen et al. | 257/593 |
| 8,383,464 | B2 * | 2/2013 | Fenouillet-Beranger et al. | 438/149 |
| 8,384,193 | B2 * | 2/2013 | Lin et al. | 257/579 |
| 8,569,866 | B2 * | 10/2013 | Suligoj et al. | 257/557 |
| 2002/0072178 | A1 | 6/2002 | Cai et al. | |
| 2004/0110353 | A1 * | 6/2004 | Mallikarjunaswamy | 438/309 |
| 2007/0205487 | A1 * | 9/2007 | Ikeda | 257/565 |
| 2010/0200919 | A1 | 8/2010 | Kikuchi | |
| 2011/0108942 | A1 * | 5/2011 | Fenouillet-Beranger et al. | 257/503 |
| 2013/0277753 | A1 * | 10/2013 | Clark et al. | 257/378 |

OTHER PUBLICATIONS

Benoist et al., "Improved ESD Protection in Advanced FDSOI by Using Hybrid SOI/Bulk Co-integration," Electrical Overstress/Electrostatic Discharge Symposium (EOS/ESD), 32$^{nd}$ IEEE, Piscataway NJ, pp. 1-6 Oct. 3, 2010.

* cited by examiner

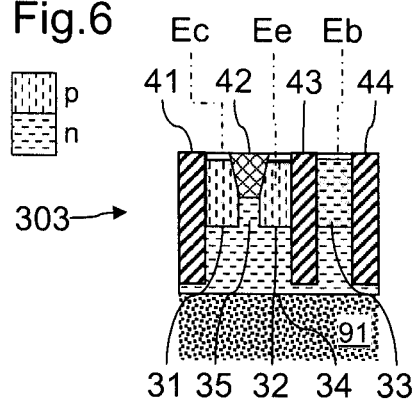
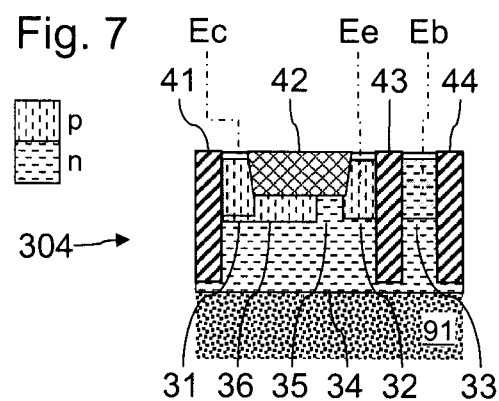
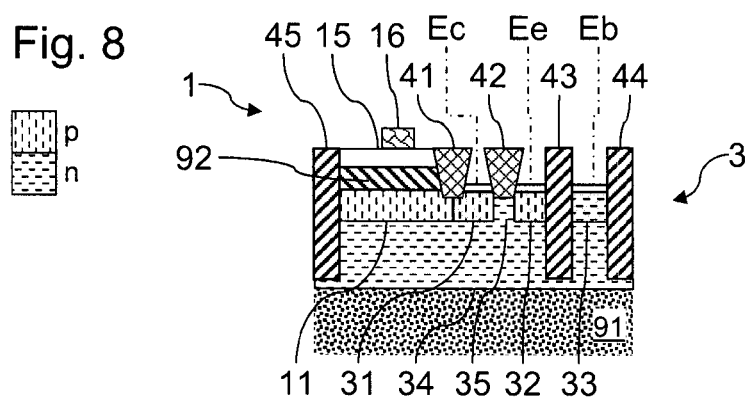
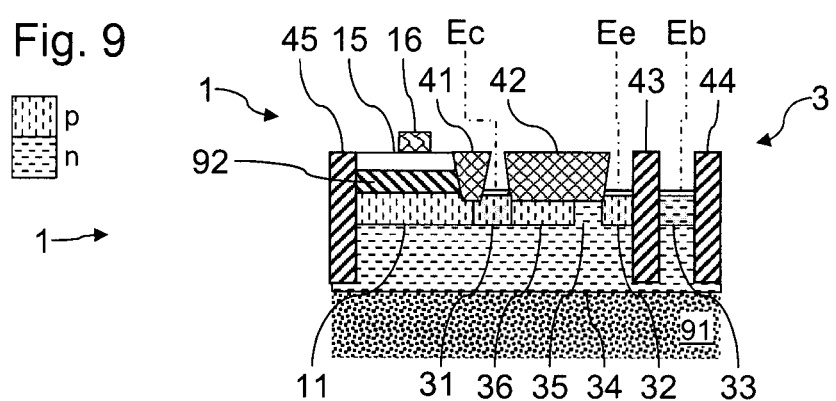

US 9,029,955 B2

INTEGRATED CIRCUIT ON SOI COMPRISING A BIPOLAR TRANSISTOR WITH ISOLATING TRENCHES OF DISTINCT DEPTHS

RELATED APPLICATIONS

Under 35 USC 119, this application claims the benefit of the priority date of French Application No. 1256806, filed on Jul. 13, 2012, the contents of which are herein incorporated by reference.

FIELD OF INVENTION

The invention relates to integrated circuits, and in particular the integrated circuits produced on a substrate of silicon on insulator (SOI) type. SOI technology consists in separating a thin layer of silicon (a few nanometers) on a substrate of silicon with a relatively thick layer of insulator (a few tens of nanometers as a general rule).

BACKGROUND

The integrated circuits produced in SOI technology offer a certain number of advantages. Such circuits generally exhibit a lower electrical consumption for equivalent performance levels. Such circuits also induce lower stray capacitances, so that the switching speed can be improved. Furthermore, the stray triggering ("latchup") phenomenon encountered with MOS transistors in bulk technology can be avoided. Such circuits therefore prove particularly suited to applications of SoC or MEMS type. It is also found that the SOI integrated circuits are less sensitive to the effects of ionizing radiation and thus prove more reliable in applications where such radiations can induce operating problems, notably in space applications. The SOI integrated circuits may notably include random access memories of SRAM type or logic gates.

Reducing the steady-state consumption of logic gates while increasing their switching speed is the subject of a great deal of research. Some integrated circuits being developed incorporate both logic gates with low consumption and logic gates with high switching speed. To generate these two types of logic gates on one and the same integrated circuit, the threshold voltage of certain transistors of the fast-access logic gates is lowered, and the threshold voltage of other transistors of the logic gates with low consumption is increased. In bulk technology, the modulation of the threshold voltage level of transistors of the same type is performed by differentiating the level of doping of their channel. However, in FDSOI ("Fully Depleted Silicon On Insulator") technology, the doping of the channel is almost zero ($10^{15}$ $cm^{-3}$). Thus, the level of doping of the channel of the transistors cannot therefore exhibit significant variations, which prevents the threshold voltages from being differentiated in this way. One solution proposed in certain studies for producing transistors of the same type with distinct threshold voltages is to incorporate different gate materials for these transistors. However, the practical production of such an integrated circuit proves technically difficult and economically prohibitive.

SUMMARY OF THE INVENTION

In order to have distinct threshold voltages for different transistors in FDSOI technology, it is also known practice to use a biased ground plane arranged between the thin layer of insulating oxide and the silicon substrate. By acting on the doping of the ground planes and on their bias, a range of threshold voltages can be defined for the different transistors. It will thus be possible to have so-called low threshold voltage transistors LVT, so-called high threshold voltage transistors HVT and so-called average, or "standard", threshold voltage transistors SVT.

To enable the different transistors to operate, it is necessary to electrically isolate them from one another. Consequently, the transistors are generally surrounded by the isolating trenches (referred to by the acronym STI, for "Shallow Trench Isolation") which extend to the wells.

As is known, such integrated circuits also include devices protecting against accidental electrostatic discharges (ESD) that can damage these transistors.

There is a need for protection against the electrostatic discharges that does not impact on the compactness of the integrated circuit, that is capable of removing a localized discharge regardless of its bias, and that is inexpensive. The invention thus relates to an integrated circuit as defined in the appended claims.

BRIEF DESCRIPTION OF THE DRAWINGS

Other features and advantages of the invention will emerge clearly from the description which is given thereof hereinbelow, as an indication and in a nonlimiting manner, with reference to the appended drawings, in which:

FIG. 6 is a transversal cross-sectional view of a bipolar transistor according to a fifth variant;

FIG. 7 is a transversal cross-sectional view of a bipolar transistor according to a sixth variant;

FIG. 8 is a transversal cross-sectional view of an example of bipolar transistor attached to a field-effect transistor;

FIG. 9 is a transversal cross-sectional view of another example of bipolar transistor attached to a field-effect transistor.

DETAILED DESCRIPTION OF THE INVENTION

The invention proposes using, in an integrated circuit of SOI type, isolating trenches of different depths and dimensions in order to produce bipolar transistors.

Figure 1:
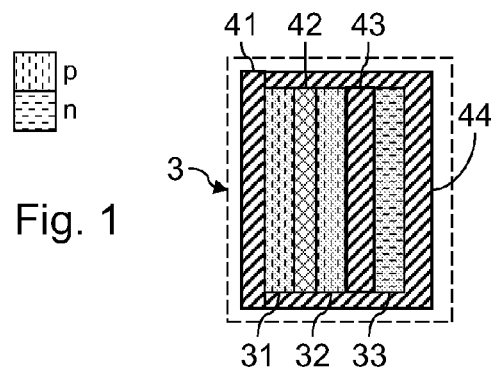
FIG. 1 is a schematic plan view of a portion of integrated circuit at the ground planes level of a bipolar transistor according to a first variant.
Figure 2:
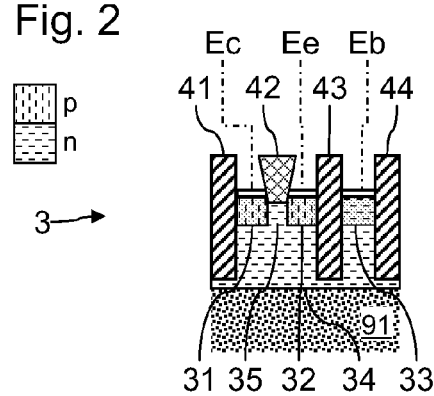
FIG. 2 is a transversal cross-sectional view of the bipolar transistor illustrated in FIG. 1.

FIG. 1 is a schematic plan view of a portion of an integrated circuit of SOI type. The integrated circuit here comprises a bipolar transistor 3. The bipolar transistor 3 is illustrated in transversal cross section in FIG. 2. The integrated circuit comprises other electronic components formed on a buried isolating layer, not illustrated here.

The transistor 3 is formed plumb with a semiconductor substrate 91. This substrate 91 has a p-type doping. The transistor 3 here is of pnp type. The transistor 3 comprises a collector 31, an emitter 32 and a base contact 33. The collector 31 includes a semiconductor element with p-type doping, the emitter 32 comprises a semiconductor element with p-type doping, and the base contact 33 comprises a semiconductor element with n-type doping. A semiconductor element with n-type doping forms:

on the one hand, a well 34 plumb with the collector 31, the emitter 32 and the base contact 33;

on the other hand, a base 35 forming a junction between the collector 31 and the emitter 32.

The collector 31, the emitter 32 and the base contact 33 here include implanted areas formed above the well 34. The implanted areas advantageously have respective dopings P+, P+ and N+. The base 35 and the implanted areas of the collector 31, of the emitter 32 and of the base contact 33 are here coplanar. The term "coplanar" should be understood to mean that it is possible to define a plane passing through the areas concerned and parallel to the buried isolating layer detailed hereinbelow. The collector 31, the emitter 32 and the base contact 33 are connected respectively to potentials Ec, Ee and Eb. A bipolar transistor 3 is thus formed in which the base contact is laterally offset relative to the collector and to the emitter.

At its periphery, the transistor 3 comprises an isolating trench 44 extending depthwise to the well 34. The transistor 3 here comprises, also at its periphery, an isolating trench 41 extending depthwise to the well 34. The transistor 3 also comprises an isolating trench 43 extending depthwise to the well 34. The isolating trench 43 separates or is interposed between the emitter 32 and the base contact 33. The isolating trench 43 does not extend to the substrate 91. Thus, the well 34 forms a continuous semiconductor element between the base contact 33 and the base 35. The base 35, for example, is formed in continuity with the semiconductor element in which the well 34 is formed. The isolating trenches 41 and 44 do not extend to the substrate 91.

The transistor 3 also comprises an isolating trench 42 formed plumb with the base 35. The trench 42 preferably has a width of at least 40 nm for a 20 nm technological node. The isolating trench 42 extends into the base 35, beyond the top face of the collector 31 and of the emitter 32. The isolating trench 42 extends, for example, between 5 and 50 nm below the top surface of the collector 31 or of the emitter 32. The isolating trench 42 may also extend between 5 and 50 nm below the buried isolating layer of the integrated circuit for a transistor 3 of FDSOI type. The bottom of the buried isolating layer is here at the level of the top surface of the collector 31, of the emitter 32 and of the base contact 33. The isolating trench 42 does not, however, extend to the interface between the well 34 and the collector 31 or the emitter 32. The isolating trench 42 is shallower than the isolating trenches 43 and 44.

Thus, a bipolar transistor 3 is obtained for which the properties of the base 35 are particularly well controlled during the fabrication process. Moreover, for a use of the transistor 3 in protecting the integrated circuit against electrostatic discharges, such a transistor greatly limits the occurrence of an overcurrent by the snapback phenomenon. The use of an isolating trench 43 that is deeper than the isolating trench 42 makes it possible to increase the triggering sensitivity of the protection to limit the overcurrent induced in the transistor 3 when it is passed through by an electrostatic discharge.

The well 34 may have a concentration of dopants of between $10^{16}$ cm$^{-3}$ and $10^{18}$ cm$^{-3}$. The well 34 may extend to a depth less than 1 μm and, preferably, less than or equal to 700 nm.

Advantageously, the implanted areas of the collector 31, of the emitter 32 and of the base contact 33 each exhibit a concentration of dopants at least fifty times, or a hundred times greater than the concentration of dopants of the well 34. For example, these implanted areas have concentrations of dopants advantageously greater than or equal to $5*10^{18}$ cm$^{-3}$ and, preferably, between $10^{19}$ cm$^{-3}$ and $10^{21}$ cm$^{-3}$.

Figure 3:
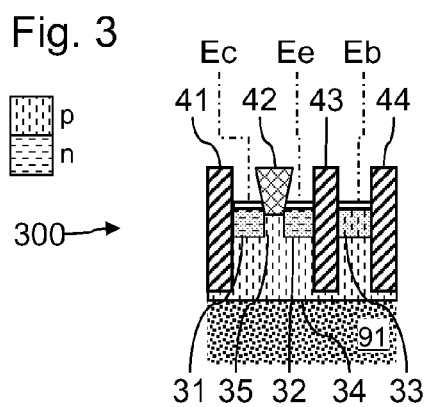
FIG. 3 is a transversal cross-sectional view of a bipolar transistor according to a second variant.

FIG. 3 is a transversal cross-sectional view of a variant bipolar transistor 300 of the integrated circuit. The transistor 300 here is of npn type. The transistor 300 has a structure identical to that of FIG. 2 and is differentiated therefrom by the types of doping used. Thus, the collector 31 includes a semiconductor element with n-type doping, the emitter 32 comprises a semiconductor element with n-type doping, and the base contact 33 comprises a semiconductor element with p-type doping. A semiconductor element with p-type doping forms:

on the one hand, the well 34 plumb with the collector 31, the emitter 32 and the base contact 33;

on the other hand, the base 35 between the collector 31 and the emitter 32.

The base 35 and the implanted areas of the collector 31, of the emitter 32 and of the base contact 33 are here coplanar.

Figure 4:
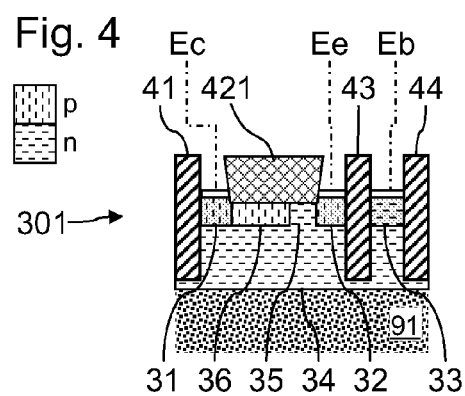
FIG. 4 is a transversal cross-sectional view of a bipolar transistor according to a third variant.

FIG. 4 is a transversal cross-sectional view of another variant bipolar transistor 301 of the integrated circuit. The transistor 301 is here of pnp type. The transistor 301 has trenches 41, 43 and 44 similar to those of the transistor of FIG. 2. The collector 31, the emitter 32, the base contact 33 and the well 34 of the transistor 301 of FIG. 4 have a structure and a doping that are identical to those of the transistor of FIG. 3. The isolating trench 42 here has a width greater than the width of the trench 42 of the transistor of FIG. 2. The isolating trench 421 has the same depth as the trench 42 of the transistor of FIG. 2. The trench 421 is here formed plumb with a semiconductor element 36 and the base 35. The semiconductor element 36 is interposed in contact with the collector 31 and the base 35. The semiconductor element 36 forms an extension of the collector 31 under the isolating trench 421. The trench 421 preferably has a width of at least 80 nm for a 20 nm technological node. The semiconductor element 36 comprises a p-type doping and is in contact with the collector 31. The semiconductor element 36 advantageously comprises a width at least equal to 40 nm for a 20 nm technological node.

The semiconductor element 36, the base 35 and the implanted areas of the collector 31, of the emitter 32 and of the base contact 33 are here coplanar. The addition of the semiconductor element 36 makes it possible to increase the base/emitter breakdown voltage of the transistor 301.

Figure 5:
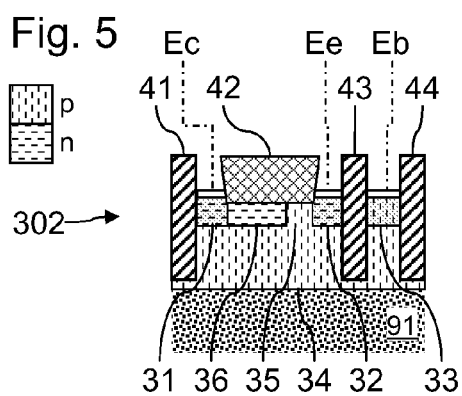
FIG. 5 is a transversal cross-sectional view of a bipolar transistor according to a fourth variant.

FIG. 5 is a transversal cross-sectional view of a variant bipolar transistor 302 of the integrated circuit. The transistor 302 is here of npn type. The transistor 302 has a structure identical to that of FIG. 4 and is differentiated therefrom by the types of doping used. Thus, the collector 31 includes a semiconductor element with n-type doping, the emitter 32 comprises a semiconductor element with n-type doping, and the base contact 33 comprises a semiconductor element with p-type doping. The semiconductor element 36 comprises an n-type doping. A semiconductor element with p-type doping forms:

on the one hand, the well 34 plumb with the collector 31, the emitter 32 and the base contact 33;

on the other hand, the base 35 between the semiconductor element 36 and the emitter 32.

The semiconductor element 36, the base 35 and the implanted areas of the collector 31, of the emitter 32 and of the base contact 33 are here coplanar.

FIG. 6 is a transversal cross-sectional view of another variant bipolar transistor 303 of the integrated circuit. The transistor 303 is identical to that of FIG. 2 apart from the structure of the collector 31, of the emitter 32, and of the base contact 33. In this example, by means of an epitaxial regrowth, a collector 31, an emitter 32, and a base contact 33 have been produced that are flush with the top surface of the isolating trenches 41 to 44. Consequently, the top surface of the collector 31, of the emitter 32, and of the base contact 33 is arranged above the bottom of the buried isolating layer for a transistor 303 of FDSOI type.

FIG. 7 is a transversal cross-sectional view of another variant of a bipolar transistor 304 of the integrated circuit. The transistor 304 is identical to that of FIG. 4 apart from the structure of the collector 31, of the emitter 32, and of the base contact 33. In this example, by means of an epitaxial regrowth, a collector 31, an emitter 32, and a base contact 33 have been produced that are flush with the top surface of the isolating trenches 41 to 44. Consequently, the top surface of the collector 31, of the emitter 32, and of the base contact 33 is arranged above the bottom of the buried isolating layer for a transistor 304 of FDSOI type.

In the example of FIG. 8, the bipolar transistor 3 is attached to a field-effect transistor 1. The transistor 1 is, for example, an nMOS or pMOS transistor. The transistor 1 comprises, as is known per se, a source, a drain and a channel, and a gate stack plumb with the channel. The source, the drain and the channel of the transistor 1 are formed in the active semiconductor layer 15. The transistor 1 comprises a gate stack 16 arranged over the active semi-conductor layer 15, plumb with the channel. To simplify the drawings, the detailed structure of the active layers is not represented therein. The transistor 1 can be of FDSOI type and comprise, as is known per se, a channel of weakly doped semiconductor material, with a concentration of dopants substantially equal to the concentration of dopants of the substrate 91. The transistor 1 also comprises source and drain electrodes, which are not illustrated.

The transistor 1 is formed plumb with a buried isolating layer 92. The buried isolating layer 92, as is known per se, electrically isolates the transistor 1 from its ground plane 11, from its well 34, and from the substrate 91.

A semiconductor ground plane 11 is formed plumb with the transistor 1, under the buried isolating layer 92. The doping of the ground plane 11 is here of the same type as the doping of the collector 31, that is to say of p-type. The implanted area of the collector 31 is in contact with the ground plane 11. The ground plane 11 is therefore biased to the potential Ec. The biasing of the ground plane 11 can be done via a control circuit that is not represented here. The well 34 extends laterally to plumb with the ground plane 11.

The buried isolating layer 92 formed plumb with the transistor 1 is here of UTBOX ("Ultra-Thin Buried Oxide") layer type. Thus, controlling the biasing of the ground plane 11 makes it possible to modulate the threshold voltage of the transistor 1. The isolating layer 92 has, for example, a thickness less than or equal to 60 nm, less than or equal to 50 nm, even less than or equal to 20 nm. The isolating layer 92 can be produced, as is known per se, in silicon oxide.

An isolating trench 45 is formed at the periphery of the transistor 1. The isolating trench 45 extends through the buried isolating layer 92, to the well 34. The isolating trench 45 advantageously has a depth identical to the isolating trenches 43 and 44.

The isolating trench 41 is here formed plumb with the contact between the ground plane 11 and the implanted area of the collector 31. The isolating trench 41 extends through the buried isolating layer 92. The isolating trench 41 does not extend to the well 34 or to the bottom of the collector 31, in order to allow a contact between the collector 31 and the ground plane 11. The isolating trench 41 advantageously has the same depth as the isolating trench 42.

The ground plane 11 may have a concentration of dopants of between $10^{18}$ cm$^{-3}$ and $10^{19}$ cm$^{-3}$. The concentrations of dopants of the implanted areas of the collector 31, of the emitter 32 and of the base contact 33 are, for example, substantially equal to the concentrations of dopants of the source or of the drain of the transistor 1. Metallic contacts can be deposited after siliconizing directly on each of the implanted areas of the collector 31, of the emitter 32 and of the base contact 33, in order to allow for an electrical connection for each of them.

The bipolar transistor 3 can be used in combination with the field-effect transistor 1. The transistor 3 can, for example, be used to protect the transistor 1 against electrostatic discharges, or be controlled by the transistor 1 to close in the presence of an electrostatic discharge. The combination of transistors 1 and 3 entails only a small reduction in the integration density:

the collector 31 of the bipolar transistor 3 is also used to bias the ground plane 11;

the emitter 32 of the bipolar transistor 3 is also used to bias the well 34 plumb with the transistor 1.

FIG. 9 illustrates another exemplary bipolar transistor 3 attached to a field-effect transistor 1. This example differs from that of FIG. 8 only by the use of a bipolar transistor 3 as defined with reference to FIG. 4. In this example, the transistor 3 advantageously provides the transistor 1 with increased protection against the electrostatic discharges by virtue of a higher base/collector breakdown voltage. The triggering threshold of the transistor 3 is here raised, which is useful in particular for a use with high voltage levels.

Obviously, the bipolar transistors of FIGS. 6 and 7 may be attached to a field-effect transistor.

The invention claimed is:

1. A manufacture comprising an integrated circuit, said integrated circuit comprising a semiconductor substrate, a layer of silicon in which electronic components are formed, a buried isolating layer arranged between said semiconductor substrate and said layer of silicon, a bipolar transistor comprising a collector having a first type of doping, an emitter having said first type of doping, a base having a second type of doping different from said first type of doping, and a base contact having said second type of doping, said base forming a junction with said collector and with said emitter, said collector, said emitter, said base contact, and said base being coplanar, a well having said second type of doping and arranged plumb with said collector, said emitter, said base contact, and said base, said well separating said collector, said emitter, and said base contact from said substrate, said well extending between said base contact and said base, a first isolating trench arranged plumb with said base and extending in a depth direction between five and fifty nanometers beyond said buried isolating layer but without reaching a bottom of said emitter and said collector, a second isolating trench arranged between said base contact and said collector and said emitter, said second isolating trench extending to a depth beyond said buried isolating layer into said well, said depth being greater than a depth of said first isolating trench.

2. The manufacture of claim 1, wherein said collector, said emitter, and said base contact each include a semiconducting implanted area having a concentration of dopants at least fifty times greater than a concentration of dopants in said well.

3. The manufacture of claim 2, wherein said collector comprises a semiconductor element in contact with a semiconducting implanted area and with said base, said semiconductor element having said first type of doping, said base being in contact with said semiconducting implanted area of said emitter.

4. The manufacture of claim 3, wherein said first isolating trench has a width at least equal to eighty nanometers.

5. The manufacture of claim 2, wherein said semiconducting implanted area of said collector has a dopant concentration that is at least fifty times greater than a dopant concentration in said semiconductor element.

6. The manufacture of claim 2, wherein said base is in contact with said semiconducting implanted area of said collector and with said semiconducting implanted area of said emitter.

7. The manufacture of claim 2, wherein a top face of said semiconducting implanted areas is flush with a top part of said first isolating trench.

8. The manufacture of claim 1, further comprising a field-effect transistor formed plumb with said buried isolating layer, a ground plane formed plumb with said field-effect transistor, said ground plane being in contact with an electrode selected from the group consisting of said collector and said emitter, and having said first type of doping, and a third isolating trench arranged plumb with said contact between said ground plane and said electrode, and extending through said buried isolating layer without reaching said well.

9. The manufacture of claim 8, wherein said collector and said emitter are arranged between said base contact and said field-effect transistor.

10. The manufacture of claim 8, wherein said field-effect transistor is an FDSOI transistor.

11. The manufacture of claim 8, wherein said well extends to and is plumb with said ground plane.

\* \* \* \* \*

UNITED STATES PATENT AND TRADEMARK OFFICE
CERTIFICATE OF CORRECTION

PATENT NO.         : 9,029,955 B2                           Page 1 of 1
APPLICATION NO.    : 13/933396
DATED              : May 12, 2015
INVENTOR(S)        : Claire Fenouillet-Beranger et al.

It is certified that error appears in the above-identified patent and that said Letters Patent is hereby corrected as shown below:

On the Title Page, Item [73]

Please replace (73) Assignees: Commissariat á l' énergie atomique et aux énergies alternatives, Paris (FR); STMicroelectronics SA, Mountrouge (FR) to read:

Commissariat á l' énergie atomique et aux énergies alternatives, Paris (FR); STMicroelectronics SA, Montrouge (FR)

Signed and Sealed this
First Day of March, 2016

Michelle K. Lee
*Director of the United States Patent and Trademark Office*